United States Patent [19]

Beaucourt et al.

[11] Patent Number: 5,446,463
[45] Date of Patent: Aug. 29, 1995

[54] DEVICE WITH HIGH LINEARITY FOR LIMITATION OF A CHARACTERISTIC OF A SIGNAL, AND USE OF THE DEVICE IN A RADAR RECEPTION SYSTEM

[75] Inventors: Dominique Beaucourt, Gif S/Yvette; Daniel Lemaire, Fontenay Aux Roses; Gilles Weschler, Issy Les Moulineaux, all of France

[73] Assignee: Thomson-CSF, Paris, France

[21] Appl. No.: 196,370

[22] Filed: Feb. 15, 1994

[30] Foreign Application Priority Data

Feb. 23, 1993 [FR] France ............... 93 02055

[51] Int. Cl.⁶ .............. G01S 7/285; H03G 11/04
[52] U.S. Cl. ............................. 342/198; 327/73
[58] Field of Search .......... 342/175, 198; 307/358, 307/359; 328/168, 169, 171; 327/73

[56] References Cited

U.S. PATENT DOCUMENTS

| | | | |
|---|---|---|---|
| 3,974,400 | 8/1976 | Takeda et al. | 307/553 |
| 3,988,694 | 10/1976 | Yamazaki | 380/278 |
| 4,433,256 | 2/1984 | Dolikian | 307/358 |
| 4,631,737 | 12/1986 | Davis et al. | 307/358 |
| 5,111,202 | 5/1992 | Rivera et al. | 341/139 |
| 5,166,632 | 11/1992 | Mackenzie | 328/169 |

Primary Examiner—Ian J. Lobo
Attorney, Agent, or Firm—Oblon, Spivak, McClelland, Maier, & Neustadt

[57] ABSTRACT

Disclosed is device with high linearity for limitation of a characteristic of a signal to a maximum value $S_{max}$, and notably the amplitude of a radar signal in a reception system with high linearity. The device comprises a limiter having a limitation threshold $S_{lim}$ that can be switched over to two possible values $S_h$ and $S_b$ chosen so as to be respectively higher and lower than $S_{max}$ and means to activate the switching over of the limitation threshold $S_{lim}$ to either one of the foregoing values, depending on whether a measurement representing a characteristic of the signal such as the amplitude delivered by measurement means is higher or lower than a given comparison threshold $V_H$. A device such as this is very useful in a radar reception system with high linearity carrying out an analog-digital encoding of the radar signal, for it protects the encoder used from saturation with a minimum lowering of performance characteristics in terms of dynamic range and linearity.

7 Claims, 3 Drawing Sheets

DEVICE WITH HIGH LINEARITY FOR LIMITATION OF A CHARACTERISTIC OF A SIGNAL, AND USE OF THE DEVICE IN A RADAR RECEPTION SYSTEM

FIELD OF THE INVENTION

The present invention relates to a device with high linearity for limitation of a characteristic of a signal, and notably of the amplitude of a radar signal in a reception system with high linearity.

DESCRIPTION OF THE PRIOR ART

The use of a limiter in standard reception systems of radar installations is known.

The purpose of a limiter is to fulfil a function of limiting the received signal before it has been encoded. This is done in order to prevent the signal from exceeding the maximum possible level of encoding and of consequently causing a digital saturation or damaging the encoder. This limitation function must be fulfilled with a minimum degradation of the performance characteristics in terms of dynamic range and linearity.

Standard limiters possess a power transfer function whose shape is represented by the curve 1 of FIG. 1. In this figure, the power $P_e$, plotted on the x-axis, and the power $P_s$, plotted on the y-axis, respectively represent the input and output power values of a standard prior art limiter. Dotted or dashed lines have been used to show the maximum encoding maximum $S_{max}$ of an encoder that is assumed to be at output of the limiter. A limit threshold $S_{lim}$ is defined for the limiter. This limit threshold represents the maximum output power that a signal delivered by the limiter may have. This threshold $S_{lim}$ is below the maximum $S_{max}$, so that there is never any risk of digital saturation. Below the threshold $S_{lim}$, the output power $P_s$ is a linear function of the input power $P_e$.

In a standard reception system, the degradation of the linearity introduced by such limiters remains acceptable. However, in a reception system with high linearity, the use of standard limiters has the major drawback described here below:

In order to derive the maximum benefit from the dynamic range of the encoder used in the reception system without any risk of saturation, the input signal of the limiter should be brought as close as possible to the maximum encoding level $S_{max}$ by means of the preceding stages. The input signal is therefore very close to the limitation threshold $S_{lim}$.

Now, this is done to the detriment of the performance in terms of linearity, for this performance is optimal only during a so-called "small signal" operation, namely for input signals having levels far below the limitation threshold $S_{lim}$.

The use of a standard limiter to obtain protection against a digital saturation of the encoder therefore comes up against incompatibility between, on the one hand, the search for an optimum exploration of the dynamic range of the encoder and, on the other hand, the need for optimum performance in terms of linearity.

SUMMARY OF THE INVENTION

An aim of the present invention is to propose a limitation device that does not have the above incompatibility.

More specifically, an object of the present invention is a device with high linearity for limitation of a characteristic of a signal to a predetermined maximum value $S_{max}$, wherein said device includes:

a limiter receiving said signal at its input and having a limitation threshold $S_{lim}$ that can be switched over to two possible predetermined values $S_h$ and $S_b$ that are respectively higher than and lower than the maximum value $S_{max}$;

measuring circuit receiving said signal at their input and delivering a measurement that represents the characteristic;

activating circuit to activate the switching over of the limitation threshold $S_{lim}$ to the value $S_h$ when said measurement is lower than a comparison treshold $V_H$ and to the value $S_b$ when the measurement is higher than the comparison threshold $V_H$, the comparison treshold $V_H$ being adjusted in such a way that the characteristic of said signal is never higher than the maximum value $S_{max}$.

An object of the invention is also a use of the device according to the invention in a high linearity radar system wherein the device is placed in series between a receiver that gives it a radar signal and an analog-digital converter whose maximum encoding maximum is equal to said threshold value $S_{max}$.

BRIEF DESCRIPTION OF THE DRAWINGS

The invention as well as its advantages will be understood more clearly from the following description, made with reference to the appended drawings, of which.

DESCRIPTION OF THE PREFERRED EMBODIMENTS

Figure 1:
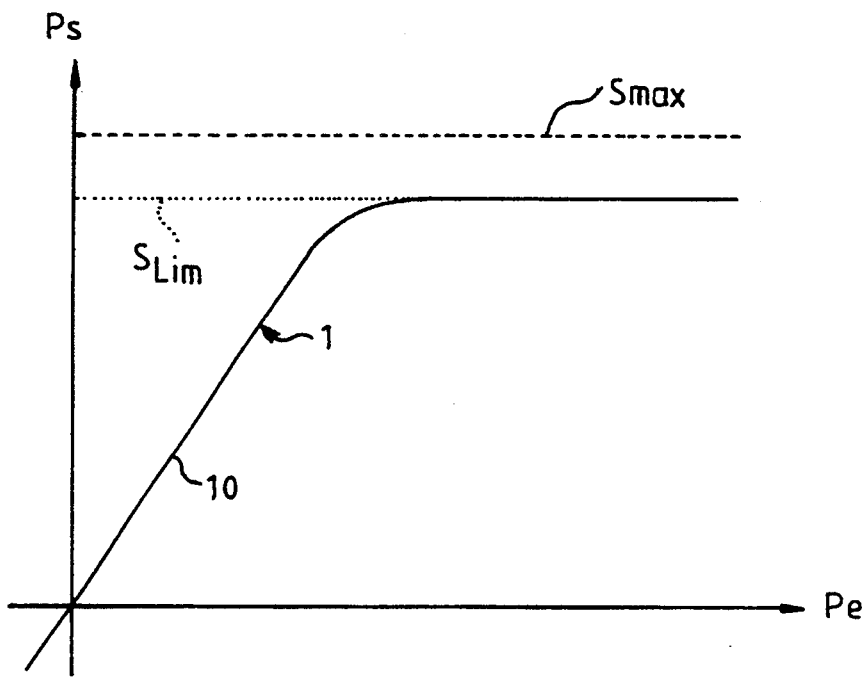
FIG. 1 shows the shape of the power transfer function of a conventional limiter.

FIG. 1 has already been described here above.

Figure 2:
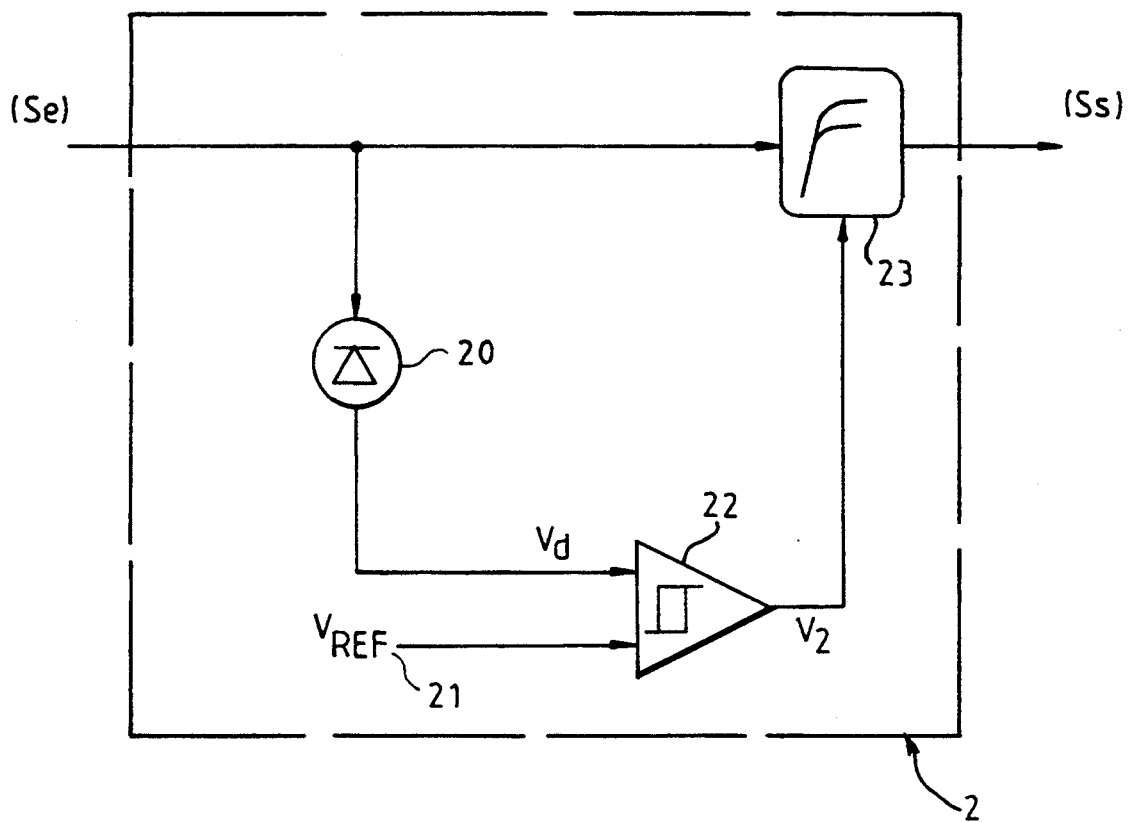
FIG. 2 is a schematic diagram of the operation of the device according to the invention.

FIG. 2 illustrates the principle of operation of a limitation device 2 according to the invention for the limiting of a signal. This limitation device essentially comprises a limiter 23 whose limiting threshold $S_{lim}$ can be controlled and a checking arm constituted by means 20 for measuring a characteristic of the processed signal, for example the amplitude, and control means 21, 22 that automatically control the limitation threshold of the limiter according to the value of the voltage $V_d$ delivered by the measuring means 20.

More specifically, depending on the value of this voltage $V_d$, the limitation threshold $S_{lim}$ of the limiter can be switched over to two possible predetermined values $S_h$ and $S_b$ that are respectively higher and lower than the maximum value $S_{max}$ of the encoder.

So long as the signal $S_e$ at input of the device 2 has an amplitude below the maximum value $S_{max}$, the limiter has a limitation threshold with a high value $S_h$. The limiter then works in "small signal" mode, thus making it possible to obtain optimum performance in linearity.

On the contrary, as soon as the measuring means 20 deliver a voltage $V_d$ representing a signal having an excessively high characteristic that is close to the encoding threshold $S_{max}$, the control means 21, 22 automatically achieve a real-time reduction of the limitation threshold of the limiter 23 to the second value $S_b$. The encoder is thus protected against saturation.

Similarly, the limitation level is automatically raised to the value $S_h$ once the input signal falls again sufficiently below the encoding threshold $S_{max}$.

The switching over of the threshold of the limiter has the advantage of not disturbing the signal as would be done by a switch-over device that would be located before a prior art limiter with a threshold and would have the role of preventing an input signal that does not need to be limited from passing into the into the limiter. A switch-over device such as this would make it necessary, in addition, to provide for another route for the signal so that it is delivered to the encoder without going through the limiter.

Figure 3:
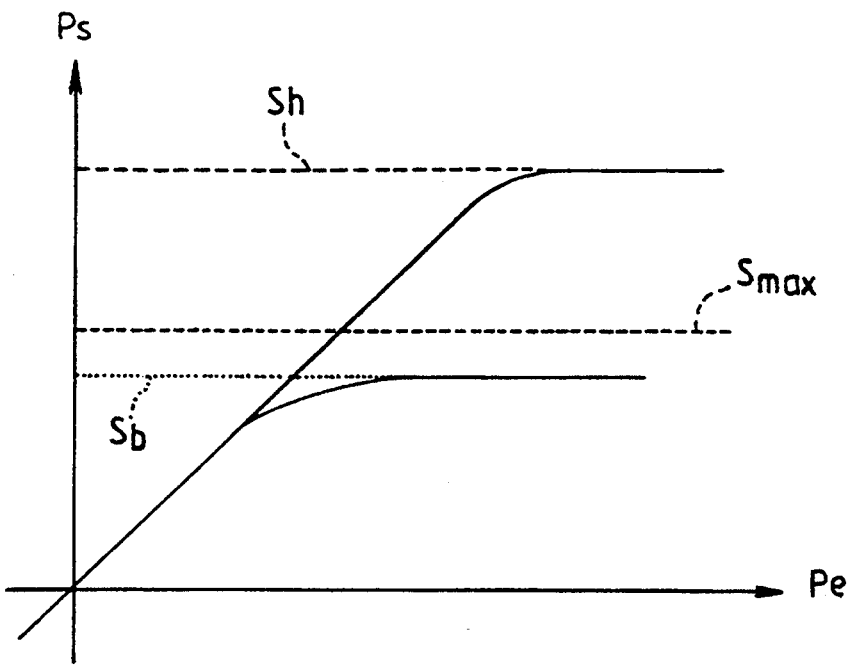
FIG. 3 shows the shape of the power transfer function of the limitation device according to the invention.

FIG. 3 shows the power transfer function of the device according to the invention, according to the value of the limitation threshold $S_{lim}$.

The high threshold $S_h$ is chosen so as to be sufficiently greater than the encoding threshold $S_{max}$ for the device to work in "small signal" mode when there is no risk that the input signal will give rise to any saturation. For example, if a linearity of about 60 dB is desired, the high threshold $S_h$ will preferably be chosen at a value of at least 10 dB above $S_{max}$. The linearity of the reception system then does not undergo any deterioration and it is then possible to take advantage of the entire dynamic range of encoding.

The low threshold $S_b$, for its part, is chosen so that it is sufficiently close to the maximum encoding level, for example at 2 dB below $S_{max}$.

The values referred to here above quite clearly depend on the performance characteristics sought, as well as on the technology used.

Figure 4:
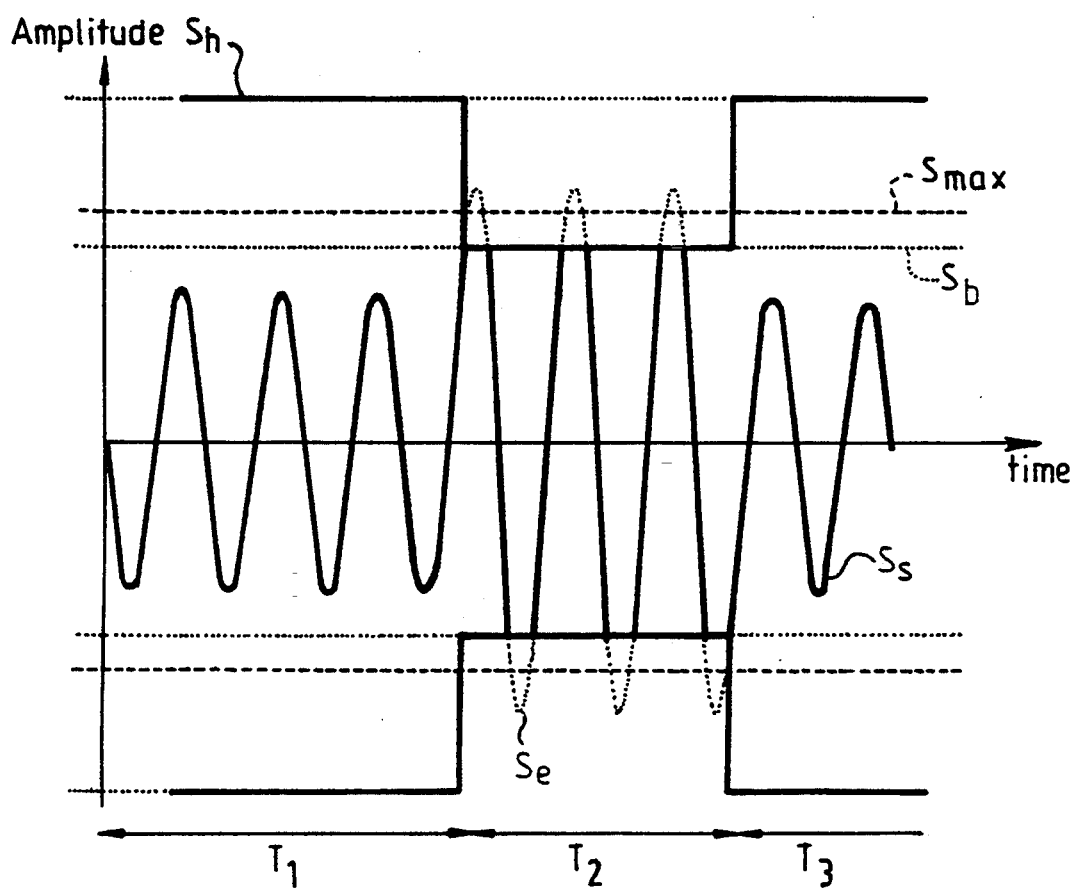
FIG. 4 is a timing diagram illustrating the action of the limitation device according to the amplitude of the input signal $S_e$.

FIG. 4 is a timing diagram illustrating the form of the signal $S_s$ at output of a limitation device according to the invention, receiving a sinusoidal signal $S_e$ with variable amplitude.

During the time intervals $T_1$ and $T_3$, the amplitude of the signal $S_e$ is below the encoding maximum $S_{max}$. The limiter has a limitation threshold $S_h$ that does not cause deterioration in the linearity of the device. The output signal $S_s$ is identical to the input signal $S_e$.

By contrast, in the time interval $T_2$, the amplitude of the signal $S_e$ exceeds the value $S_{max}$. The limiter is then switched over to its limitation threshold $S_b$ so as not to saturate the encoder.

Figure 5:
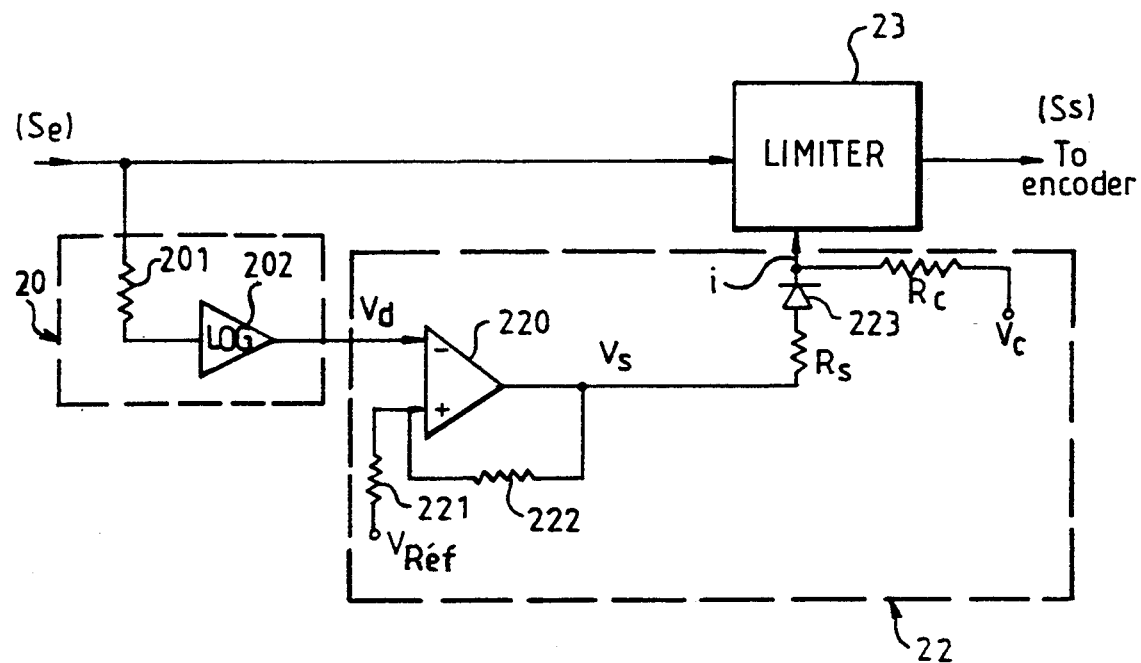
FIG. 5 is a possible embodiment of a limitation device according to the invention.

FIG. 5 shows a non-restrictive example of an embodiment of a limitation device according to the invention. The input signal $S_e$ considered is, for example, a microwave analog radar signal.

Preferably, the measurement means 20 detect the amplitude of the signal present at the input of the limiter. The decision to switch the limiter over to one of the two possible limitation thresholds is taken by analysis of the value $V_d$ of this detected amplitude. Advantageously, the measurement means 20 detect the amplitude of the signal by means of a logarithmic amplifier 202 that can be used to pick up the signal in a high impedance element 201 without disturbing the microwave line.

The decision to switch the limiter over to one of the two possible limitation thresholds $S_h$, $S_b$ is taken at the level of the control means 22, by comparison of the value $V_d$ of the amplitude detected with at least one comparison threshold $V_H$ of a comparator 220 delivering a voltage $V_s$ representing the comparison. This threshold $V_H$ is adjusted by the value of a reference voltage $V_{REF}$ and a resistor 221 in such a way that, in the presence of an input signal that entails no risk of causing a saturation, the limiter is positioned at its top threshold $S_h$. In the exemplary embodiment of FIG. 5, the limiter 23 is controlled in terms of current by the value of the current i at its control input and indirectly by the value of the voltage $V_s$ at output of the comparator 220. To do this, the control means 22 have available, in addition to the comparator 220, a current control set up by means of two resistors $R_s$ and $R_c$ and a supply $V_c$.

So long as the value $V_d$ of the detected amplitude is below the threshold $V_H$ of the comparator 220, this comparator delivers a DC voltage $V_s$, and the current i at input of the limiter 23 is given by the relationship:

$$i = \frac{V_s}{R_s} + \frac{V_c}{R_c}$$

corresponding to the top threshold $S_h$ of the limiter 23.

As soon as this value $V_d$ becomes higher than the threshold $V_H$ of the comparator, this comparator delivers another voltage value below the threshold $V_H$, for example zero, and the current i is expressed by the relationship:

$$i = \frac{V_c}{R_c}$$

corresponding to the bottom threshold $S_b$ of the limiter 23.

The resistor $R_c$ and the supply $V_c$ make it possible here to adjust the bottom threshold value $S_b$ and the resistor $R_s$ makes it possible to adjust the top threshold value $S_h$. A diode 223 prevents the current passing into the resistor $R_c$ from passing also into the resistor $R_s$.

In the preferred embodiment illustrated in FIG. 5, the comparator 220 is advantageously a hysteresis comparator with two thresholds having values that are determined in a known way by the resistors 221, 222 and by the reference voltage $V_{REF}$. When the detected amplitude $V_d$ exceeds the first threshold $V_H$, the comparator flips over and activates the switching over of the limitation threshold of the limiter. The comparison threshold of the comparator 220 is then diminished to the second value $V_L$, which is lower than $V_H$, so as to prevent any unwanted switch-over due, for example, to the ripple of the input signal. As soon as the detected amplitude $V_d$ again falls below this second threshold $V_L$, the limiter 23 is again switched over to its top limitation threshold $S_h$. The limiter 23 used may be a commercially available limiter or else a mixer used as a limiter, such as a ring mixer.

Figure 6:
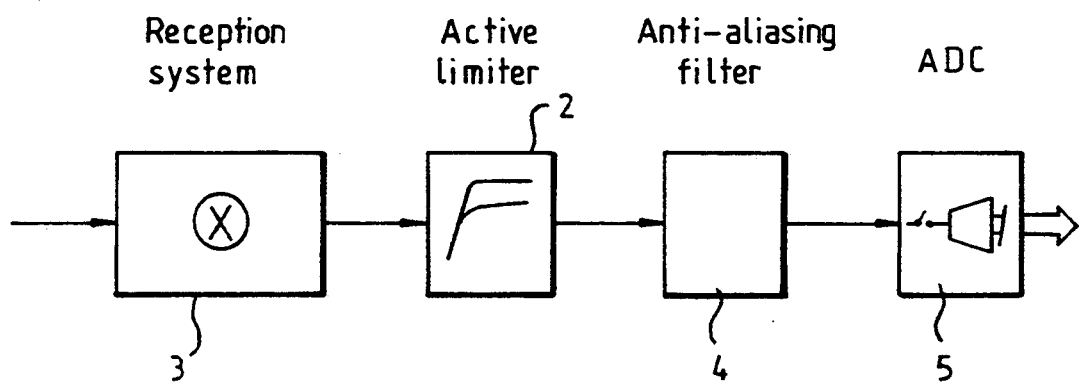
FIG. 6 shows the use of a device according to the invention in a radar reception system.

FIG. 6 illustrates an example of a use of a limitation device according to the invention as described here above in the reception system of a radar. The limitation device 2 is herein placed in series between a standard microwave receiver 3 and an anti-aliasing filter 4 followed by an analog-digital converter 5. The role of the anti-aliasing filter 4 is to suppress the harmonics generated by the limiter when it operates on its bottom threshold.

The device with high linearity for limitation according to the invention used in a reception system with high linearity thus enables the exploration, in an optimal way, of the entire dynamic range of the encoder with minimum deterioration of the performance characteristics in terms of linearity.

What is claimed is:

1. A high linearity device for limitation of a characteristic of an input signal to a predetermined maximum value $S_{max}$ and providing an output signal which is in linear relation with said input signal, wherein said device comprises:

a limiter having an input for receiving said input signal and having a limitation threshold $S_{lim}$ which limitation threshold is switched between one of two possible predetermined values $S_h$ and $S_b$ which are respectively higher than and lower than said maximum value $S_{max}$;

measuring means having an input for receiving said input signal and delivering a measurement value which represents the characteristic;

means to activate said switching of the limitation threshold $S_{lim}$ to the value $S_h$ when said measurement value is lower than a comparison threshold $V_H$ and to the value $S_b$ when said measurement value is higher than said comparison threshold $V_H$, the comparison threshold $V_H$ being a value such that the characteristic of said signal is never higher than the maximum value $S_{max}$.

2. A device according to claim 1, wherein the measurement means carry out a detection of the amplitude of the signal and give a value $V_d$ representing the amplitude detected.

3. A device according to claim 2, wherein the measurement means are constituted by an impedance element receiving the signal and a logarithmic amplifier outputting said value $V_d$.

4. A device according to claim 1, wherein the means to activate the switching of said limitation threshold $S_{lim}$ comprises a comparator having at least one threshold representing said comparison threshold $V_H$ and delivering a voltage $V_s$ having a value which is a function of the result of the comparison.

5. A device according to claim 4, wherein the comparison threshold $V_H$ has a value such that the limitation threshold $S_{lim}$ of the limiter is switched over to the value $S_h$ when the characteristic of said signal is below the maximum value $S_{max}$.

6. A device according to any of the claims 4 or 5, wherein the control means furthermore comprise a current-based control formed by two resistors $R_s$ and $R_c$ in series, supplied at their free end respectively with the voltage $V_s$ and a supply $V_c$, the control current being taken between the two resistors.

7. A device according to claim 4, wherein the comparator is a hysteresis comparator having a second comparison threshold $V_L$ that is lower than $V_H$.

* * * * *